US011791564B2

(12) United States Patent
Lee et al.

(10) Patent No.: US 11,791,564 B2
(45) Date of Patent: Oct. 17, 2023

(54) NEAR-FIELD ANTENNA FOR REMOTE RADIO CONTROL OF AN ANTENNA ARRAY

(71) Applicant: Keysight Technologies, Inc., Santa Rosa, CA (US)

(72) Inventors: Gregory S. Lee, Mountain View, CA (US); Dieter W. Vook, Mountain View, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 19 days.

(21) Appl. No.: 17/255,479

(22) PCT Filed: Sep. 5, 2018

(86) PCT No.: PCT/US2018/049448
§ 371 (c)(1),
(2) Date: Dec. 23, 2020

(87) PCT Pub. No.: WO2020/050824
PCT Pub. Date: Mar. 12, 2020

(65) Prior Publication Data
US 2021/0265742 A1      Aug. 26, 2021

(51) Int. Cl.
*H01Q 21/06*      (2006.01)
*H01Q 9/30*      (2006.01)
(Continued)

(52) U.S. Cl.
CPC ............. *H01Q 21/06* (2013.01); *H01Q 7/00* (2013.01); *H01Q 9/30* (2013.01); *H01Q 15/14* (2013.01); *H04B 5/02* (2013.01)

(58) Field of Classification Search
CPC ........ G01R 29/10; H01Q 15/14; H01Q 21/06; H01Q 7/00; H01Q 9/30; H04B 17/3912; H04B 5/02
(Continued)

(56) References Cited

U.S. PATENT DOCUMENTS 9,800,355 B1    10/2017  Lee et al.
9,985,733 B1 *   5/2018  Lee ................... H04B 17/15
(Continued)

FOREIGN PATENT DOCUMENTS

CN      101904051 A1     12/2010
CN      202475420 U      10/2012
(Continued)

OTHER PUBLICATIONS

International Search Report dated Jun. 9, 2015, 12 pgs.
(Continued)

*Primary Examiner* — Tan H Trinh (57) ABSTRACT

A system tests a device under test (DUT) that includes an antenna. The system includes a probe antenna, a network emulator, and a near-field antenna. The probe antenna measures beam characteristics of a beam-locked beam emitted over the air by the antenna of the DUT as the DUT is moved relative to the probe antenna during testing of the DUT. The network emulator emulates a base station of a communications network in communications with the DUT. The near-field antenna maintains a call link between the network emulator and the DUT using surface waves between the near-field antenna and the DUT as the DUT is moved relative to the probe antenna.

20 Claims, 5 Drawing Sheets

(51) Int. Cl.
  *H01Q 7/00* (2006.01)
  *H01Q 15/14* (2006.01)
  *H04B 5/02* (2006.01)

(58) Field of Classification Search
  USPC ............... 455/41.1, 41.2, 272; 324/750.16
  See application file for complete search history.

(56) References Cited

U.S. PATENT DOCUMENTS

| | | | |
|---|---|---|---|
| 10,483,636 B1* | 11/2019 | Koto | H04B 17/20 |
| 10,564,202 B2* | 2/2020 | Schrattenecker | G01S 7/40 |
| 10,601,695 B2 | 3/2020 | Kyosti et al. | |
| 2009/0153394 A1 | 6/2009 | Navarro et al. | |
| 2009/0323652 A1* | 12/2009 | Chen | H04B 15/00 370/338 |
| 2012/0263056 A1* | 10/2012 | Smith | H04L 25/0208 455/272 |
| 2013/0093447 A1* | 4/2013 | Nickel | G01R 29/10 324/750.16 |
| 2015/0048858 A1 | 2/2015 | Nickel et al. | |
| 2015/0093987 A1* | 4/2015 | Ouyang | H04B 5/0043 455/41.1 |
| 2016/0037286 A1* | 2/2016 | Narasimhan | H04B 5/0043 455/41.1 |
| 2018/0062971 A1 | 3/2018 | Kyosti et al. | |
| 2018/0212695 A1 | 7/2018 | Kyrolainen et al. | |
| 2018/0227060 A1* | 8/2018 | Mellein | H04B 17/30 |
| 2018/0323888 A1* | 11/2018 | Rowell | H04B 17/3912 |
| 2018/0331429 A1* | 11/2018 | Kornaros | H02J 50/27 |
| 2018/0337738 A1* | 11/2018 | Wen | H04B 17/12 |
| 2019/0132064 A1* | 5/2019 | Rowell | H04B 17/18 |
| 2019/0221938 A1* | 7/2019 | Kuroiwa | H01Q 9/27 |
| 2019/0313266 A1* | 10/2019 | Rowell | G01R 29/0871 |
| 2020/0136732 A1* | 4/2020 | Verma | H04B 17/17 |
| 2021/0311102 A1* | 10/2021 | Ryan | H04B 17/102 |

FOREIGN PATENT DOCUMENTS

| | | |
|---|---|---|
| CN | 105868978 A | 8/2016 |
| CN | 107800495 A | 3/2018 |
| JP | 2011-19031 A | 1/2011 |

OTHER PUBLICATIONS

Japanese Office Action dated Oct. 4, 2022 with English translation, 5 pgs.
Chinese Office Action and Search Report dated Feb. 22, 2023, application No. 201880095580.3, 6 pgs.
English translation of Chinese Office Action dated Feb. 22, 2023, 2 pgs.
English translation of Search Report dated Feb. 22, 2023, 3 pgs.
Japanese Notice of Allowance dated May 31, 2023, application No. 2021-502490, 3 pgs.
English translation of Japanese Notice of Allowance dated May 31, 2023, 1 pg.

* cited by examiner

Figure 1
CATR

**Figure 2
FAR-FIELD CHAMBER**

Figure 3A

Quasi-monopole

Figure 3B

Diversity pair
of monopoles

NEAR-FIELD ANTENNA FOR REMOTE RADIO CONTROL OF AN ANTENNA ARRAY

CROSS REFERENCE TO RELATED APPLICATIONS

The present application is the U.S. National Phase application under 35 U.S.C. § 371 of International Application No. PCT/US2018/049448 filed on Sep. 5, 2018, and published as WO2020050824A1 on Mar. 12, 2020. The entire disclosure of PCT/US2018/049448 is specifically incorporated by reference herein.

BACKGROUND

Antennas are used in communications such as wireless telecommunications. In wireless telecommunications, a wireless mobile device may communicate with a base station that provides wireless coverage for a cell. The wireless mobile device and the base station may each include an antenna and may each be separately subjected to testing as a device under test (DUT). When the wireless mobile device is the DUT, a test system known as a network emulator may be used in the testing to emulate the base station.

An antenna of a wireless mobile device may be an array with multiple coordinated antennas used in multiple-input multiple-output (MIMO) communications to exploit multipath propagation. As such, the antenna array may be subject to complex testing using the network emulator. For example, the antenna array may be an advanced antenna wherein each antenna in the antenna array is individually logically controllable to collectively form a beam. A complex weight pattern is introduced to the advanced antenna in a time domain signal to form the beam.

A typical MIMO test system for testing a DUT includes an anechoic chamber, the DUT in the anechoic chamber, and the network emulator. An anechoic chamber is a chamber designed to absorb reflections of sound (or electromagnetic) waves. During over the air (OTA) testing, beams from the DUT antenna are received and measured. The network emulator analyzes beam characteristics to evaluate the transmit and/or receive capabilities of the DUT in the OTA testing. Beam characteristics of the DUT that are measured and analyzed include, e.g., radiation profile, effective isotropic radiated power, total radiated power, error-vector-magnitude (EVM) of the modulation, adjacent channel leakage ratios (ACLRs), and an antenna radiation pattern. The beam characteristics may be taken for a range of beam angles and/or widths and compared against expectations to measure whether the DUT works properly.

Millimeter wave (mmWave) is the band of spectrum between 30 gigahertz (GHz) and 300 gigahertz. The next telecommunications standards (i.e., beyond the current 4G LTE telecommunications standards) are referred to as 5th generation (5G) telecommunications standards, and may standardize communications systems that use mmWave spectrum due to the large spectral bandwidth available. Proposed bands in the mmWave spectrum are near 28 GHz and 39 GHz, with some additional proposed applications near 60 GHz. Telecommunications standards such as 5G and 4G LTE are examples of radio access protocols and standards that define a timing scheme including the order and timing of communications actions for communications in a defined portion of the radio frequency spectrum such as the mmWave spectrum.

For OTA testing, matched antennas are typically proportional to ~¼ or ½ of the wavelength. Signal power received by the matched antennas is given by the Friis Equation as follows:

$$\frac{P_r}{P_t} = \left(\frac{A_r A_t}{R^2 \lambda^2}\right) = \frac{G_r G_t c^2}{(4\pi R)^2 f^2} \quad (1)$$

The Friis Equation shows that received power drops off as a function of frequency squared. In practice the drop off can be even higher due to atmospheric absorption. Additionally, mmWave signals may have high attenuation when routed in circuit boards or coaxial cables. To overcome high path loss, mmWave communication antenna systems are designed to have high directivity in the desired direction of transmission. In testing, beamformed transmissions with high directivity are used to exercise a DUT antenna, such as by varying the angle of arrival (AoA).

To achieve the high directivity, mmWave communications antenna systems are designed with integrated antennas which are antenna arrays of patch antennas. When the amplitude and phase is adjusted between the patches, a beam of radio frequency (RF) energy can be formed. The energy can be directed instead of being sent uniformly into all of space, which mitigates somewhat the geometry-based power reduction. The integrated antennas also increase the antenna cross-sectional area, which increases antenna gain. As the wavelength becomes small, patches on the integrated antenna which are ½ a wavelength apart can be ~5 mm or less on center. This enables directly mounting the integrated antenna on an integrated circuit (IC) which serves as an RF driver, minimizing (or eliminating) losses from a lossy printed circuit board (PCB) or in coaxial transmission.

With the advent of integrated antennas and integrated circuit RF drivers, a wireless mobile device as the DUT may leave no place to plug in RF test equipment using industry standard cables and connectors between the integrated circuit RF driver and integrated antenna. This makes it difficult to identify whether a problem is due to the design of the integrated antenna or the design of the integrated circuit RF driver, so all testing is then necessarily performed OTA. That is, with the evolution of wireless communication technologies, integrated antennas with direct connections to (i.e., integrated with) RF transceivers of DUTs, and having no RF connectors, are becoming increasingly common. Overall performance of such a DUT presently must be tested "over-the-air," since there is no place to connect a coaxial cable from the DUT and/or the integrated antenna to the test equipment. In fact, due to integration of integrated antennas, overall DUT performance may now necessarily be tested as a function of the integrated antenna configuration.

For some OTA testing, test developers have an interest in maintaining a call connection between a DUT and a network emulator during the testing. For example, an antenna beam profile may be locked in place in "beam-lock" while measuring the antenna beam profile as the DUT is rotated. However, the DUT antenna is directional, so the network emulator may drop the call during the rotation if/when the signal from the DUT antenna becomes too low.

For 4G (LTE) and 5G testing, the process of maintaining the call connection while testing is referred to as Radio Resource Control (RRC) connected mode. In LTE, with lower frequencies below 6 GHz, DUTs typically have omnidirectional antennas, in which case the DUTs do not impact the ability to maintain a test link to the device. In 5G New Radio (5G NR), the integrated antennas are directional, and some testing must be done under beam-lock conditions. In beam-lock conditions, the antenna gain profile is fixed relative to the DUT geometry as the DUT is rotated or otherwise moved. Because the DUT is prevented from adapting to the rotation during beam-lock as it otherwise would without beam-lock, the testing may result in insufficient signal to maintain the call connection, in which case the call is dropped. A near-field antenna for remote radio control of an antenna array as described herein mitigates the issue of the network emulator dropping the call connection when the signal between the DUT and the network emulator becomes too low.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, as a DUT is moved relative to at least one probe antenna used by a network emulator. According to various embodiments, a near-field antenna (separate from the at least one probe antenna) maintains a call link between the network emulator and the DUT using surface waves between the near-field antenna and the DUT. The near-field antenna may also receive radiated energy from the DUT, including radiated energy of the beams from the DUT. However, the near-field antenna is configured and arranged specifically to receive non-radiated surface waves from the DUT to maintain the call link.

Figure 1:
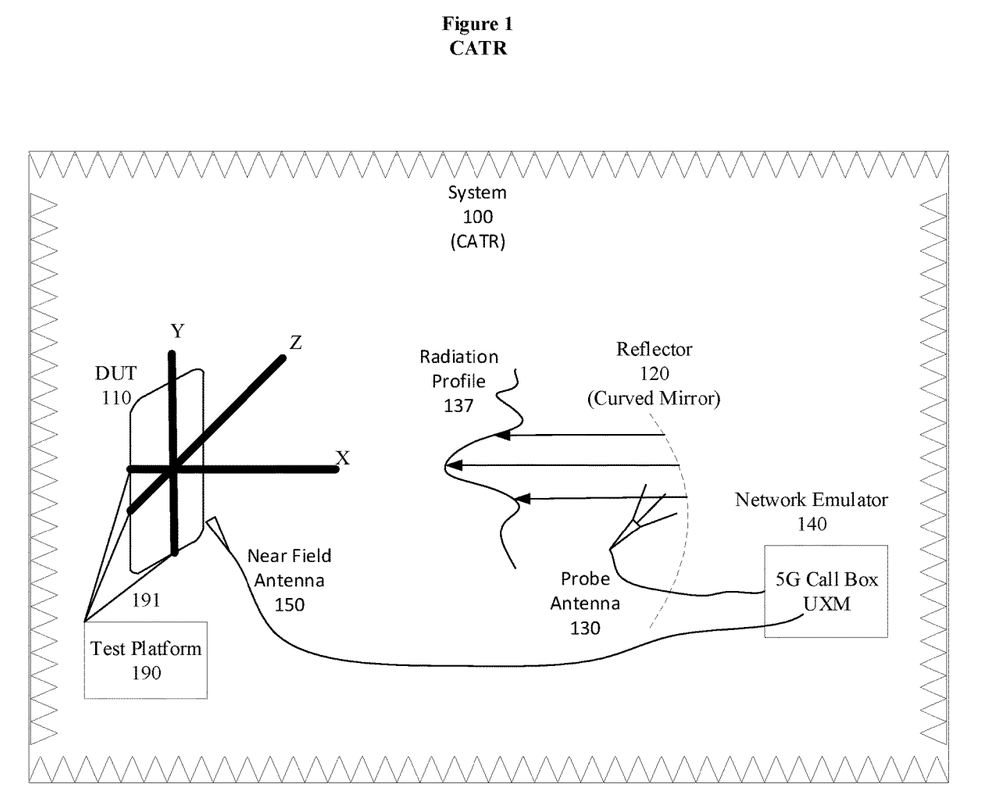
FIG. 1 illustrates a system that includes a near-field antenna for remote radio control of an antenna array, in accordance with a representative embodiment.

FIG. 1 illustrates a system that includes a near-field antenna for remote radio control of an antenna array, in accordance with a representative embodiment. In the embodiment of FIG. 1, a system 100 includes a DUT 110, a reflector 120, a probe antenna 130 connected to a network emulator 140, a near-field antenna 150, and a test platform 190. The system 100 is used for testing a device, i.e., the DUT 110, and specifically an antenna array 115 of the DUT 110.

The system 100 may be or include a compact antenna test range (CATR), which is an enclosed system that acoustically isolates the interior of the system 100 from the exterior of the system 100. Absorbing foam 145 may be used to achieve the acoustic isolation for the system 100. Accordingly, when the system 100 is or includes a CATR, the system 100 may be anechoic. Absorbing foam 145 may be used to line the walls of a chamber of the CATR to minimize internal reflections, typically by several tens of decibels. The absorbing foam 145 may be an electromagnetic wave absorbing material.

The DUT 110 may be a mobile communications device such as a wireless user device that operates at, e.g., 28 GHz. The DUT 110 includes the antenna array 115 with antennas 116, 117, 118 and 119 uniformly spaced at, e.g., $\lambda/2$ (where $\lambda$ is the wavelength of the RF signal transmitted from the antenna array 115). The antenna array 115 may be the integrated antenna that is integrated with the DUT 110. Transmit and receive chains of the DUT 110 may be directly connected to the elements of the antenna array 115 with no RF connections/connectors, as opposed to a separate and independently measurable antenna. The antennas 116, 117, 118 and 119 are representative of individual antennas or antenna elements in an antenna array 115. The antennas 116, 117, 118 and 119 may be representative of a matrix, though the antenna array 115 may include various other numbers and arrangements of the antenna, depending on the design of the DUT 110. A total number of individual antennas or antenna elements in an antenna array 115 may be in the tens, or hundreds or more, and each of the antennas or antenna elements represented by antennas 116, 117, 118 and 119 may be individually logically controllable. The testing in the system 100 primarily involves testing the antenna array 115 and the antennas or antenna elements represented by antennas 116, 117, 118 and 119. In the system 100 in FIG. 1, the antenna array 115 may be an approximately uniform source that has characteristics of a single antenna.

The test platform 190 may support and move the DUT 110 during testing using support arms 191. For example, the DUT 110 may be rotated about any of axis X, axis Y or axis Z shown in FIG. 1. Any two of axis X, axis Y or axis Z defines a plane perpendicular to the remaining one of axis X, axis Y or axis Z. As such, the DUT 110 may be rotated or otherwise moved in three dimensions, and the test platform 190 may therefore change the angle of the DUT 110 through the rotation.

The reflector 120 may be a curved mirror (such as a parabolic mirror) for reflecting RF signals. The reflector 120 may also or alternatively be multiple mirrors, or a hybrid that includes a curved mirror and/or multiple mirrors and is used to reflect RF signals from the antenna array 115. Additionally, or alternatively, a reflector 120 may be supplemented or replaced with other optical elements such as dielectric lenses. In the system 100 of FIG. 1, the antenna array 115 illuminates the reflector 120 where the resulting reflection may be nearly perfectly collimated. In this way, the antenna array 115 can be positioned in the collimated beam, and its radiation pattern determined as the received power changes as a function of rotation angle (elevation and azimuth) of the DUT 110. The collimated reflection from the reflector 120 allows the DUT 110 to be characterized in the far-field in a more compact chamber than would otherwise be possible without the reflector 120.

The probe antenna 130 receives a beam emitted OTA by the antenna array 115, and measures beam characteristics of the beam emitted OTA by the antenna array 115 as the DUT 110 is moved relative to the probe antenna 130 during testing of the DUT 110. The probe antenna 130 can also transmit with the DUT 110 insofar as the network emulator 140 (described below) may emulate a cell tower that both talks and listens to the DUT 110. The probe antenna 130 may include an antenna array with a matrix of individual antennas. The probe antenna 130 is representative of one or more probe antennas which may be used to measure beam characteristics of the beam emitted OTA by the antenna array 115. Examples of parameters of the DUT 110 that can be detected and measured from characteristics of a beam received by the probe antenna 130 may include an error-vector-magnitude (EVM) and adjacent channel leakage ratios (ACLRs). Example parameters specific to the antenna array 115 include radiation profile, effective isotropic radiated power, and total radiated power.

An example beam characteristic is the radiation profile 137 shown in FIG. 1. As mentioned previously, the beam may be beam-locked while the DUT 110 is moved, to measure characteristics of the beam with a constant antenna gain profile fixed relative to the geometry of the DUT 110 as the DUT 110 is moved. In other words, the testing may involve testing of beam characteristics of a particular beam with the same antenna gain profile while the DUT 110 is moved, which effectively measures conditions to which the DUT 110 and antenna array 115 may be subjected in use.

The network emulator 140 receives the measured beam characteristics from the probe antenna 130 and analyzes the measured beam characteristics such as by comparing measured beam characteristics to predetermined thresholds. An example of the network emulator 140 is a 5G call box such as the Keysight UXM by Keysight Technologies. During testing of the DUT 110 and the antenna array 115, a call connection may be dropped when the beam emitted OTA by the antenna array 115 is beam-locked and the DUT 110 is moved. The call connection may be dropped when the network emulator 140 senses that the signal from the beam-locked beam is too weak, and this may be due to the movement of the DUT 110 in testing. The call connection may also be dropped when the link from the network emulator 140 to the DUT 110 becomes too weak, such as if the network emulator 140 is unable to output more power as movement of the DUT 110 results in a weaker signal from the probe antenna 130 reaching the DUT 110. That is, the DUT 110 may also sense that the signal from the network emulator 140 becomes too weak as the DUT 110 is moved.

The network emulator 140 may include one or more transceiver, transmitter, mmWave head, and combiner to emulate a base station in a 5G network. A "head" as the term is used herein is representative of a radio frequency head, and is a system used as an up-frequency converter or down-frequency converter. A combiner combines two or more signals without translating either to produce a combined signal, whereas a splitter splits a combined signal into two or more signals. Down-frequency conversion involves converting a high-frequency signal such as a received high-frequency radio frequency signal lower to an intermediate frequency used by a device such as the network emulator 140. Up-frequency conversion involves converting the intermediate frequency used by the device such as the network emulator 140 to a high-frequency radio frequency signal for transmission. The conversion to an intermediate frequency is performed by mixing a carrier signal with a local oscillator signal.

The network emulator 140 or another computer may include a memory that stores instructions and a processor that executes the instructions. The processor may be configured to detect and measure characteristics of the DUT 110 and the antenna array 115 from the beam received by the probe antenna 130. A processor is tangible, non-transitory, an article of manufacture and/or a machine component. The processor is configured to execute software instructions to perform testing functions as described herein. A processor may be a general-purpose processor, part of an application specific integrated circuit (ASIC), a microprocessor, a microcomputer, a processor chip, a controller, a microcontroller, a digital signal processor (DSP), a state machine, or a programmable logic device. A processor may also be a logical circuit, including a programmable gate array (PGA) such as a field programmable gate array (FPGA), or another type of circuit that includes discrete gate and/or transistor logic. A processor may be a central processing unit (CPU), a graphics processing unit (GPU), or both. Additionally, any processor described herein may include multiple processors, parallel processors, or both. Multiple processors may be included in, or coupled to, a single device or multiple devices. The memory that stores instructions may be a main memory or a static memory. A memory is a tangible storage medium that can store data and executable instructions and is non-transitory during the time instructions are stored therein. A memory described herein is an article of manufacture and/or machine component. A memory of a network emulator 140 may be a computer-readable medium from which data and executable instructions can be read by a processor of a computer. A memory as described herein may be random access memory (RAM), read only memory (ROM), flash memory, electrically programmable read only memory (EPROM), electrically erasable programmable read-only memory (EEPROM), registers, a hard disk, a removable disk, tape, compact disk read only memory (CD-ROM), digital versatile disk (DVD), floppy disk, blu-ray disk, or any other form of storage medium known in the art. Memories may be volatile or non-volatile, secure and/or encrypted, unsecure and/or unencrypted.

The instructions from a memory may be executed by a processor to perform the analysis of mmWave signals transmitted from the antenna array 115 of the DUT 110. That is, received mmWave signals may be down-frequency converted to a frequency used in analysis in order to complete the testing of the antenna array 115. The converted signal may be analyzed to compare with predetermined thresholds. In the analysis, a beam pattern may be mapped out and compared to expectations. The actual testing of the DUT 110 and antenna array 115 may involve many forms of tests, but for the purposes of the present disclosure the testing is separable from the detecting and measuring of the surface waves of the DUT 110 in order to maintain the call connection, though the surface waves may be generated due to the antenna array 115 being subjected to the testing.

In electromagnetic fields formed by a transmitting antenna such as the antenna array 115, a so-called near-field is distinguishable from a so-called far-field. The far-field is farther from the antenna array 115 than the near-field and includes electromagnetic waves from the antenna array 115 solely generated as electromagnetic radiation. The near-field is closer to the antenna array 115 than the far-field and includes electromagnetic effects reflecting non-radiative behavior, such as from energy scattered by the DUT 110, such as by elements that protect the DUT 110 from dust or weather or by leakage from the substrate of the DUT 110.

The near-field antenna 150 may be a low-gain antenna that maintains the call connection as a call link between the network emulator 140 and the DUT 110 using surface waves between the near-field antenna 150 and the DUT 110 as the DUT 110 is moved relative to the probe antenna 130. Specifically, the near-field antenna 150 is placed in close proximity to the DUT 110 and receives surface waves from the DUT 110 without interfering with the testing of the antenna array 115 by the probe antenna 130 and network emulator 140. Moreover, the near-field antenna 150 may be representative of more than one near-field antenna placed in close proximity to the DUT 110, but in the embodiment of FIG. 1 the near-field antenna 150 is one and only one near field antenna used to maintain the call link between the network emulator 140 and the DUT 110 during testing of the DUT 110. Costs of cables, connectors and RF switches capable of carrying mmWave signals are minimized by minimizing numbers of the near-field antenna 150 used to maintain the call connection.

The near-field antenna 150 is placed in the near-field between the DUT 110 and the network emulator 140, and in a way that the near-field antenna 150 is not within the beam formed by the antenna array 115 of the DUT 110. The near-field antenna 150 may be placed well out of the beam path of the beam formed by the antenna array 115 of the DUT 110. In this way, the near-field antenna 150 avoids interfering with the beam formed by the antenna array 115 of the DUT 110 by avoiding scattering of the RF beams formed by the antenna array 115.

The term "surface wave" as used herein refers to an electromagnetic wave that exists and can be detected at and around the DUT 110, but which does not propagate indefinitely into the three-dimensional far-field until being interrupted. A surface wave may be surface scattered energy, or leakage from a substrate in the DUT 110, but will not include the directional beam formed by the antenna array 115 when the antenna array 115. Examples of surface waves include surface plasmons, Sommerfeld waves that propagate in two dimensions, and reactive near-field waves. Surface waves include very near-field (VNF) waves but are not limited to VNF waves insofar as the term "VNF" implies that a wave exists and would be detected by a near-field antenna 150 less than a wavelength away from the source. In the embodiment of FIG. 1, an antenna array 115 may be the size of a postage stamp and embedded in a case of the DUT 110 which prevents the near-field antenna 150 from approaching within a wavelength from the antenna array 115. Nevertheless, because a VNF wave may be present at or around a DUT 110, the VNF wave is an example of a surface wave as the term is used herein.

Examples of a near-field antenna 150 that detects a surface wave at or around the DUT 110 include a monopole antenna, a diversity pair of monopole antennas, a monopole antenna with a loop, and a diversity pair of monopole antennas each with a loop. Examples of near-field antennas are shown in FIGS. 3A, 3B, 3C and 3D, descriptions of which follow.

In the embodiment of FIG. 1, the system 100 may be a CATR, and the DUT 110 in the CATR may be located in the quiet zone of the chamber for the CATR, as is typical. In a CATR, a quiet zone minimizes unwanted reflections which can be added by stray reflections off of surfaces via superposition. This provides the most nearly uniform illumination (flat phase front and amplitude across the range). Generally, the quiet zone begins at a length of about 5/3 of the focal length and extends some distance further from the reflector 120 when the reflector 120 is parabolic.

Figure 2:
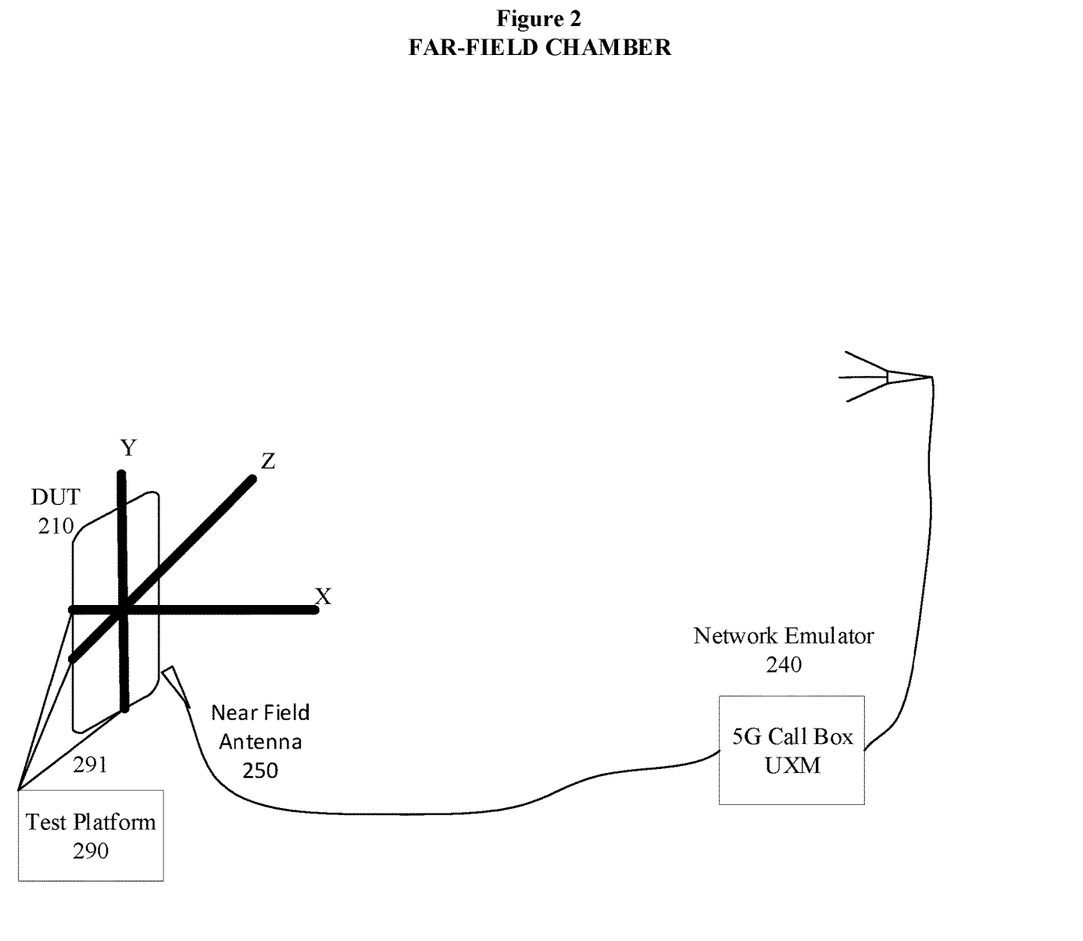
FIG. 2 illustrates another system that includes a near-field antenna for remote radio control of an antenna array, in accordance with a representative embodiment.

FIG. 2 illustrates another system that includes a near-field antenna for remote radio control of an antenna array, in accordance with a representative embodiment.

In the embodiment of FIG. 2, a system 200 includes a DUT 110, a probe antenna 230 connected to a network emulator 240, a near-field antenna 250, and a test platform 190.

The system 200 may be or include a far-field test environment. The DUT 110 and the test platform 190 may be similar or identical to the DUT 110 and test platform 190 in FIG. 1. That is, the DUT 110 may be a mobile communication device, and the test platform 190 may rotate or otherwise move the DUT 110 about or along the X axis, Y axis and/or Z axis shown in FIG. 2.

In the embodiment of FIG. 2, the near-field antenna 250 is used in a far-field testing environment. A far-field testing environment may be outdoors when the antenna array 115 has a far-field greater than, e.g., 5 meters. The near-field antenna 250 again maintains the call connection as a call link between the network emulator 240 and the DUT 110 using surface waves between the near-field antenna 250 and the DUT 110 as the DUT 110 is moved relative to the probe antenna 230. Specifically, the near-field antenna 250 is placed in close proximity to the DUT 110 and receives surface waves from the DUT 110 without interfering with the testing of the DUT 110 by the probe antenna 230 and network emulator 240.

In the far-field testing environment, radiated power from the DUT 110 decreases as the square of distance from the antenna array of the DUT 110, and absorption of the radiation does not feed back to the antenna array of the DUT 110.

In the far-field testing environment, the DUT 110 is tested using the probe antenna 230 and network emulator 240. The probe antenna 230 is representative of at least one probe antenna used in the far-field of the testing environment in FIG. 2 to test the DUT 110 and an antenna array (not shown) of the DUT 110. The probe antenna 230 measures beam characteristics of a beam emitted OTA by an antenna array of the DUT 110 as the DUT 110 is moved relative to the probe antenna 230 during testing of the DUT 110. The probe antenna 230 is used to measure beam characteristics of the beam emitted OTA by the antenna array of the DUT 110. As in the embodiment of FIG. 1, the beam may be beam-locked while the DUT 110 is moved, to measure characteristics of the beam with a constant antenna gain profile fixed relative to the DUT geometry as the DUT 110 is moved. In other words, the testing may involve testing of beam characteristics of a particular beam with the same antenna gain profile while the DUT 110 is moved, which effectively measures potential real-world conditions to which the DUT 110 may be subjected.

The network emulator 240 receives the measured beam characteristics from the probe antenna 230 and analyzes the measured beam characteristics such as by comparing measured beam characteristics to predetermined thresholds.

Figure 3A:
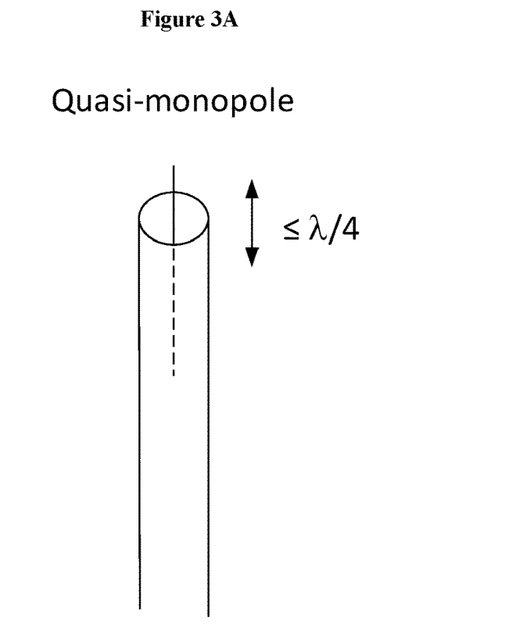
FIG. 3A illustrates a near-field antenna for remote radio control of an antenna array, in accordance with a representative embodiment.

FIG. 3A illustrates a near-field antenna for remote radio control of an antenna array, in accordance with a representative embodiment.

In the embodiment of FIG. 3A, a near-field antenna 351 is a quasi-monopole antenna. A monopole is an antenna consisting of a single pole. The near-field antenna 351 may have a rod shape, with a uniform circular cross section. The near-field antenna 351 has an omnidirectional radiation pattern perpendicular to the monopole. The length of a monopole antenna is determined by the wavelength of the radio waves is it used with. For FIG. 3A, the near-field antenna 351 has a length less than or equal to one quarter (¼) of the wavelength of the surface waves detected and measured by the near-field antenna 351.

Figure 3B:
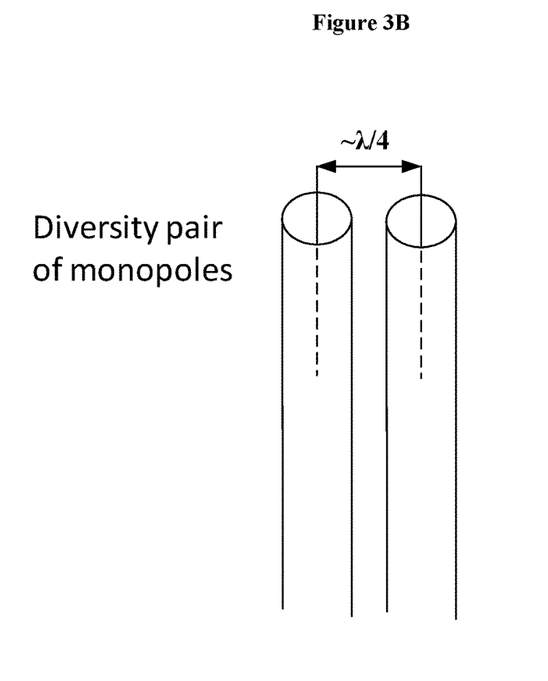
FIG. 3B illustrates another near-field antenna for remote radio control of an antenna array, in accordance with a representative embodiment.

FIG. 3B illustrates another near-field antenna for remote radio control of an antenna array, in accordance with a representative embodiment.

In the embodiment of FIG. 3B, a near-field antenna 352 is a diversity pair of monopole antennas. A diversity pair is used to improve quality and reliability of a wireless link, and in FIG. 3B is used to improve transmission and reception performance of the near-field antenna 352 compared to the near-field antenna 351 in FIG. 3A. In FIG. 3B, the diversity pair consists of two monopoles each with a rod shape having a uniform circular cross section. The two monopoles are arranged with centers of the circular cross sections at approximately one quarter of the wavelength of the surface waves detected and measured by the near-field antenna 352.

Figure 3C:
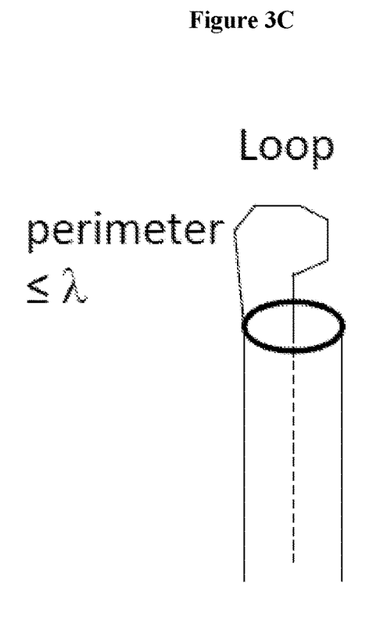
FIG. 3C illustrates another near-field antenna for remote radio control of an antenna array, in accordance with a representative embodiment.

FIG. 3C illustrates another near-field antenna for remote radio control of an antenna array, in accordance with a representative embodiment.

In the embodiment of FIG. 3C, a near-field antenna 353 is a quasi-monopole antenna with a loop. A perimeter length of the loop is less than or equal to the wavelength of the surface waves detected and measured by the near-field antenna 353. The quasi-monopole component of the near-field antenna 353 may again have a rod shape, with a uniform circular cross section. The quasi-monopole component by itself has an omnidirectional radiation pattern perpendicular to the monopole, and the length of the monopole antenna is determined by the wavelength of the radio waves is it used with and may be less than or equal to one quarter (¼) of the wavelength of the surface waves detected and measured by the near-field antenna 353. The loop component of the near-field antenna 353 has a dipole radiation pattern.

Figure 3D:
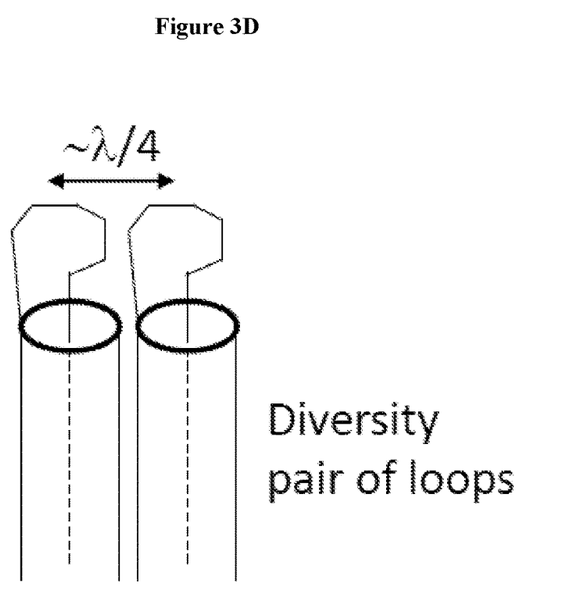
FIG. 3D illustrates another near-field antenna for remote radio control of an antenna array, in accordance with a representative embodiment.

FIG. 3D illustrates another near-field antenna for remote radio control of an antenna array, in accordance with a representative embodiment.

In the embodiment of FIG. 33, a near-field antenna 354 is a diversity pair of monopole antennas, each with a loop. The diversity pair in FIG. 33 is used to improve transmission and reception performance of the near-field antenna 354 compared to the near-field antenna 353 in FIG. 3C. In FIG. 3D, the quasi-monopole component of each of the diversity pair has a rod shape having a uniform circular cross section. The two quasi-monopole components are arranged with centers of the circular cross sections at approximately one quarter of the wavelength of the surface waves detected and measured by the near-field antenna 354. Additionally, perimeter lengths of each loop component are less than or equal to the wavelength of the surface waves detected and measured by the near-field antenna 354.

The near-field antennas 351, 352, 353, 354 in the embodiments of FIGS. 3A, 3B, 3C and 3D are designed with properties relating to the wavelengths of the signals detected and measured by the near-field antennas 351, 352, 353, 354. The detected and measured signals may include energy from beams formed by the antenna array 115 of the DUT 110, though the surface waves from the DUT 110 are the waves of interest described herein. Thus, the near-field antennas 351, 352, 353, 354 can be designed and used for testing an antenna array 115 that communicate using 4G or 5G signals. The near-field antennas 351, 352, 353, 354 in the embodiments of FIGS. 3A, 3B, 3C and 3D are insensitive to polarization.

As an example, the near-field antennas 351, 352, 353, 354 may be designed for an LTE signal with a frequency lower than 6 GHz, for use in a 5G Non-Stand Alone (NSA) mode (i.e., in mode using hybrid functionality of LTE/4G and 5G). In this example, the LTE signal with a frequency lower than 6 gigahertz (GHz) is used to maintain the call connection, while the antenna array 115 is tested using a 5G signal with a mmWave frequency of 28 GHz or 39 GHz. The higher frequency mmWave signal is the signal of interest in the testing of the antenna array 115 and corresponds to the directional and other properties of the antenna array 115 that are being tested in the testing. In other words, the near-field antennas 351, 352, 353, 354 may be designed to maintain the call connection using a first signal under 6 GHz to maintain the call connection while the antenna array 115 is tested using a second signal with mmWave frequencies for testing by the network emulator 140. Alternatively, the near-field antennas 351, 352, 353, 354 can be designed to maintain the call connection for signals in the primary 5G mode, i.e., with the same mmWave frequencies used in 5G communications during testing by the network emulator 140.

Figure 4:
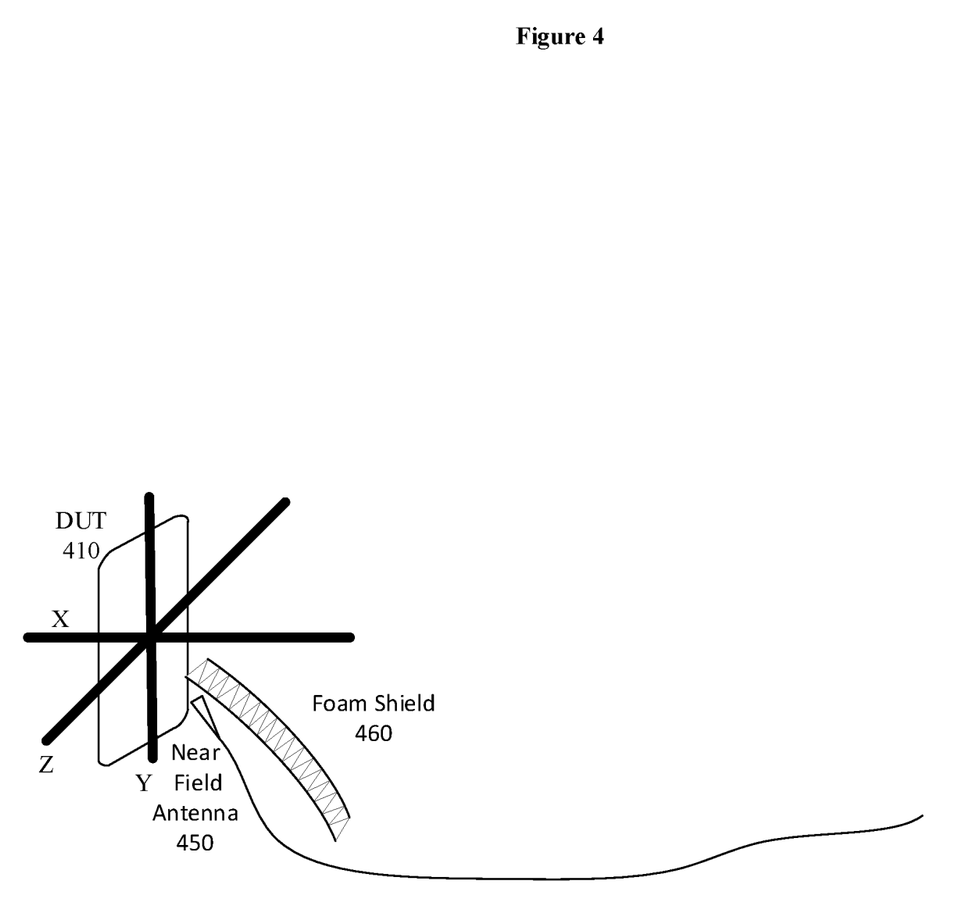
FIG. 4 illustrates another system that includes a near-field antenna for remote radio control of an antenna array, in accordance with a representative embodiment.

FIG. 4 illustrates another system that includes a near-field antenna for remote radio control of an antenna array, in accordance with a representative embodiment.

In the embodiment of FIG. 4, the system 400 includes the DUT 110, the near-field antenna 450 and the foam shield 460. The embodiment of FIG. 4 may be used or integrated with either of the embodiments of FIG. 1 or FIG. 2.

In the embodiment of FIG. 4, the foam shield 460 is used to acoustically isolate the near-field antenna 450 from an antenna array of the DUT 110.

Specifically, in 5G New Radio (5G NR), an mmWave antenna array of a DUT 110 is directional. The near-field antenna 450 is used to maintain a call connection with a network emulator (not shown) using surface waves at and around the DUT 110. The operation of maintaining the call connection using the near-field antenna 450 can be acoustically separated from the operation of testing the antenna array of the DUT 110, so as not to interfere with testing of the antenna array of the DUT 110. As a result, the near-field antenna 450 is used for remote radio control of the antenna array of the DUT 110 and reduces or eliminate the possibility of a network emulator dropping the call connection when the signal between the DUT 110 and the network emulator becomes too low. At the same time, using the foam shield 460, the near-field antenna 450 operates in a way that minimizes or reduces interference with the testing of the antenna array of the DUT 110.

The foam shield 460 may be RF absorbing foam that blocks radio frequency emissions from the near-field antenna 450 from entering the probe antenna 130 in a system 100 for a CATR, or the probe antenna 230 in a system 200 for far-field testing. As a result, the foam shield 460 prevents emissions from the near-field antenna 450 from interfering with measurements of mmWave beam properties detected and measured by the probe antenna 130 and probe antenna 230.

The foam shield 460 may be mounted on a test platform 190 or test platform 190, on the DUT 110, or on or around the near-field antenna 150, near-field antenna 250 or near-field antenna 450. For example, in the embodiments of FIG. 1 and FIG. 2, the foam shield 460 may be provided on or with one or more of the support arms 191, so that the near-field antenna 450 can be arranged at or around the DUT 110 in a manner that shields an antenna array of the DUT 110 from the near-field antenna 150.

Accordingly, the near-field antenna for remote radio control of an antenna array enables a DUT 110 to maintain a call connection with a network emulator 140 or network emulator 240. The near-field antenna 150 may be placed close to or even behind the antenna array 115 of the DUT 110. The near-field antenna 150 can be used in a CATR as in the embodiment of FIG. 1 or a far-field antenna test range as in the embodiment of FIG. 2, and may capitalize on energy generated by the antenna array 115 that is not sent in the direction of the directional beam formed by the antenna array 115 in the testing by the network emulator 140 or network emulator 240.

Field testing using a dipole antenna as the near-field antenna 150 has shown that the near-field antenna 150 can pick up signals (including the surface waves) within 35 dB of the power received from direct illumination. The dipole antenna can be created by stripping back a semi-rigid coaxial cable for this field testing, and the best results in field testing are seen when the near-field antenna 150 is used to probe in front of the antenna array 115 of the DUT 110. Field testing shows that power is still detectable and measurable even when the near-field antenna 150 picks up signals (including the surface waves) from the side of the antenna array 115 of the DUT 110 rather than from the front.

Although the near-field antenna for remote radio control of an antenna array has been described with reference to several exemplary embodiments, it is understood that the words that have been used are words of description and illustration, rather than words of limitation. Changes may be made within the purview of the appended claims, as presently stated and as amended, without departing from the scope and spirit of the near-field antenna for remote radio control of an antenna array in its aspects. Although the near-field antenna for remote radio control of an antenna array has been described with reference to particular means, materials and embodiments, the near-field antenna for remote radio control of an antenna array is not intended to be limited to the particulars disclosed; rather the near-field antenna for remote radio control of an antenna array extends to all functionally equivalent structures, methods, and uses such as are within the scope of the appended claims.

As described herein, testing of a DUT 110 and antenna array 15 can be performed in the far-field, where the antenna array 115 acts as a point source, while maintaining the call connection using a near-field antenna 150 to detect and measure surface waves at or close to the antenna array 115. The near-field antenna 150 may be dedicated specifically to maintaining the call connection when appropriate, by receiving the surface waves that are non-radiated and which do not exist beyond the near-field or, in for some forms of surface waves, beyond the very near-field.

Maintaining a call connection as described herein results from detecting surface waves of a DUT 110. The continued detection of the surface waves may result in software instructions or circuit functions in the DUT 110 and/or the network emulator 140 not triggering, specifically by not generating a fault signal indicating that a signal from the DUT 110 is dropping or dropped to levels predetermined to be correlated with a lost call. In other words, the teachings described herein may be opaque to software or circuit functions in the DUT 110 and/or the network emulator 140, which may be unaware that the near-field antenna 150 is detecting surface waves at and around the DUT 110 rather than signals otherwise used to maintain the call connection.

Although the present specification describes components and functions that may be implemented in particular embodiments with reference to particular standards and protocols, the disclosure is not limited to such standards and protocols. For example, standards such as 4G/LTE and 5G represent examples of the state of the art. Such standards are periodically superseded by more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A system for testing a device under test (DUT) comprising an antenna, the system comprising:
a probe antenna that measures beam characteristics of a beam-locked beam emitted over the air by the antenna of the DUT as the DUT is moved relative to the probe antenna during testing of the DUT;
a network emulator that emulates a base station of a communications network in communications with the DUT; and
a near-field antenna that maintains a call link between the network emulator and the DUT using surface waves between the near-field antenna and the DUT as the DUT is moved relative to the probe antenna.

2. The system of claim 1, wherein the near-field antenna comprises one and only one near-field antenna used to maintain the call link between the network emulator and the DUT during testing of the DUT.

3. The system of claim 1, wherein the near-field antenna comprises a monopole antenna.

4. The system of claim 1, wherein the near-field antenna comprises a diversity pair of monopole antennas.

5. The system of claim 1, wherein the near-field antenna comprises a monopole antenna with a loop.

6. The system of claim 1, wherein the near-field antenna comprises a diversity pair of monopole antennas each with a loop.

7. The system of claim 1, wherein the near-field antenna is maintained within a distance from the DUT of ¼th of a wavelength of the beam-locked beam during testing.

8. The system of claim 1, wherein the near-field antenna uses a signal with a frequency lower than 6 gigahertz (GHz) to maintain the call link between the network emulator and the DUT.

9. The system of claim 8, wherein the beam-locked beam emitted over the air by the antenna of the DUT has a mmWave frequency higher than 6 gigahertz.

10. The system of claim 1, further comprising:
a foam shield around the near-field antenna to block radio frequency emissions from the near-field antenna from reaching the antenna of the DUT.

11. The system of claim 1, wherein the near-field antenna uses a mmWave frequency to maintain the call link between the network emulator and the DUT, and the beam-locked beam emitted over the air by the antenna of the DUT has the mmWave frequency.

12. The system of claim 1, wherein the system comprises a compact antenna test range (CATR) with a curved mirror located therein for reflecting RF signals from the antenna of the DUT.

13. The system of claim 12, further comprising:
a test platform that rotates the DUT as the probe antenna measures beam characteristics of the beam-locked beam emitted over the air by the antenna of the DUT.

14. The system of claim 1, wherein the DUT comprises a wireless user device.

15. The system of claim 1, wherein, to maintain the call link between the network emulator and the DUT, the near-field antenna receives of surface scattered energy from the DUT or leakage from a substrate of an integrated circuit connected to the antenna of the DUT.

16. A system for testing a device under test (DUT) comprising an antenna, the system comprising:
a near-field antenna that maintains a call link between a network emulator and the DUT using surface waves between the near-field antenna and the DUT as the DUT is moved relative to a probe antenna which measures beam characteristics of a beam-locked beam emitted over the air by the antenna of the DUT during testing of the DUT, wherein the network emulator emulates a base station of a communications network in communications with the DUT as the near-field antenna maintains the call link between the network emulator and the DUT.

17. The system of claim 16, wherein the near-field antenna receives surface scattered energy from the DUT to maintain the call link between the network emulator and the DUT.

18. The system of claim 16, wherein the near-field antenna receives leakage from a substrate of an integrated circuit connected to the antenna of the DUT to maintain the call link between the network emulator and the DUT.

19. The system of claim 16, wherein the near-field antenna comprises a monopole antenna.

20. The system of claim 16, wherein the near-field antenna comprises a monopole antenna with a loop.

* * * * *